United States Patent [19]

Newell et al.

[11] Patent Number: 4,760,351

[45] Date of Patent: Jul. 26, 1988

[54] MULTIPLE OSCILLATOR DEVICE HAVING PLURAL QUARTZ RESONATORS IN A COMMON QUARTZ SUBSTRATE

[75] Inventors: Darrell E. Newell, DeKalb; Alan P. Genis, Sycamore; Gregg Westberg; Susan M. Nemes, both of DeKalb, all of Ill.

[73] Assignee: Northern Illinois University, DeKalb, Ill.

[21] Appl. No.: 899,360

[22] Filed: Aug. 22, 1986

[51] Int. Cl.[4] ........................ G01N 27/00; H03B 5/32

[52] U.S. Cl. .......................................... 331/48; 73/23; 73/DIG. 4; 310/320; 331/65; 331/162; 331/DIG. 3; 340/870.16; 340/870.26; 422/98

[58] Field of Search ....................... 331/46, 48, 49, 56, 331/65, 116 R, 116 FE, 158, 162, DIG. 3, 161; 310/320; 73/23, 24, 26, 29, 30, 517 AV, DIG. 1, DIG. 4; 324/56, 71.1, 76 R, 96, 105, 109; 340/870.1, 870.3, 870.16, 870.17, 870.26; 422/98

[56] References Cited

U.S. PATENT DOCUMENTS

| | | | |
|---|---|---|---|
| 3,416,036 | 12/1968 | Ho | 331/116 R X |
| 3,587,077 | 6/1971 | Kaldor et al. | 340/870.16 X |
| 3,879,992 | 4/1975 | Bartera | 73/30 |
| 4,361,026 | 11/1982 | Muller | 73/23 |
| 4,547,748 | 10/1985 | Ballato | 331/49 |
| 4,596,697 | 6/1986 | Ballato | 73/23 X |

*Primary Examiner*—Siegfried H. Grimm
*Attorney, Agent, or Firm*—Sughrue, Mion, Zinn, Macpeak, and Seas

[57] ABSTRACT

A system is described which comprises many quartz resonators, all formed on the same quartz substrate. The method of fabrication ensures that all the resonators are mechanically and electrically isolated from each other. The oscillation frequencies of the resonators may be individually adjusted to different desired values during fabrication. Since the deviation from the optimum angle of cut is the same for all the resonators because they are all on the same substrate, all the resonators have the same temperature coefficient (change of frequency per degree change in temperature). Mounting the electronic circuitry on the quartz substrate simplifies the interconnections between the resonators and the circuitry, and reduces the size of the resulting device.

14 Claims, 6 Drawing Sheets

MULTIPLE OSCILLATOR DEVICE HAVING PLURAL QUARTZ RESONATORS IN A COMMON QUARTZ SUBSTRATE

BACKGROUND OF THE INVENTION

The quartz crystal has been used for frequency control and precision time-keeping for decades. From the beginning of the crystal industry, engineers have been trying to develop manufacturing techniques which would relative the labor-intensive manufacturing process of cutting, lapping, polishing, plating, and tuning.

A second driving force in the crystal industry has been the need for miniaturization. With the continued efforts of the semiconductor industry to reduce device geometry and increase density, there is an increasing demand to reduce the size of the clocks and ultimately the quartz resonator itself. This has resulted in many new miniature crystal designs over the past twenty years.

In most of these earlier applications, the crystal was mounted in its own container. Fabrication techniques were developed in the seventies which allowed the placement of the crystal resonator and the active circuitry components in the same container. These devices were typically for clock oscillator applications and the circuitry was fabricated utilizing thick film processing techniques. Hybridization offered reduced production costs, greater circuit density and reduced the profile of the package, and at the same time allowing all environmentally sensitive components to be hermetically sealed in a common package.

These processing techniques also presented some problems which had to be overcome. Some of the encapsulates used to protect the bonds on the die caused problems with the crystal aging characteristics due to the long term outgassing of the materials and subsequent contamination of the crystal surfaces. A second difficulty was encountered in mounting the crystal to the alumina substrate. Lead ribbon wire was formed on one side to be reflowed to the alumina substrate and make electrical connection and support the crystal at the other end. The crystal was then typically cemented to the support using conductive epoxy. This often developed strains in the crystal blank and caused problems with frequency stability over the operating temperature range.

A major step forward was the development of the tuning fork crystal. Such forks were produced using photolithographic processing and wet chemical etching. Metallic coatings consisting of a thin layer of chromium and a thick layer of gold were placed on the surface of the quartz by vacuum deposition techniques. The surface wa then coated with photoresist and patterned to the desired geometry. This photoresist mask was then used to define the pattern in the metallization. The quartz, with the areas to be etched defined in the metal masks, was then placed in a heated etchant primarily consisting of hydrofluoric acid to chemically mill out the resonators. These processing techniques allowed batch processing of many resonators at a time, and substantially reduced production costs and resonator size. However, while plural resonators all part of a single oscillator may have been fabricated in a single quartz substrate, the resonators could not be completely isolated from one another both mechanically and electrically. Thus, plural oscillators were not formed in a the same quartz substrate since they could not operate independently of one another and their frequencies could not be accurately controlled.

There is a need, then, for a technique of fabricating plural crystal oscillators on a single quartz substrate, to promote miniaturization and facilitate manufacturing.

A further disadvantage in the prior art is that crystal oscillators formed on different substrates may have slight differences in operating characteristics despite identical fabrication techniques. This is undesirable where plural oscillators are to cooperate with one another in a circuit application where their characteristics should be matched. By way of illustration, it has been known for years that bridge or balanced type instrument configurations have an inherent stability that other types of circuits do not have. Consider, for example, the differential amplifier at the front end of an operational amplifier. Both the left side and right side transistors of the differential amplifier are manufactured in similar environments with similar doping profiles. Consequently, they are as close to being identical as possible. The input signal is applied between the two bases, and the output signal is taken between the collectors of the transistor pair. This balanced arrangement of two identical transistors results in an amplifier whose characteristics are immune to common-mode interfering signals, temperature effects, supply voltage changes, external noise, etc. For operational amplifiers, the stability of the balance is expressed in terms of the common-mode rejection ratio.

An AT-cut quartz resonator has a temperature coefficient that is a function of the angle of cut. The curves of FIG. 1 indicate the dependence of this coefficient on the angle, and show clearly that if two discrete resonators are to track over a range of temperatures, their angles of cut must be nearly identical. Thus, it has been difficult to obtain the full benefit of the balanced bridge design in circuits involving several quartz resonators, because such great attention must be paid to control both the angle of cut and the operating temperature.

SUMMARY OF THE INVENTION

It would be desirable to achieve further size reduction as well as simplification of the process of fabricating crystal oscillators.

It would be further desirable to simplify the task of matching crystal oscillators to one another in those applications where multiple oscillators must cooperate to achieve desired results.

These and other objects are achieved by a circuit and fabrication technique in which plural oscillators are formed on a common quartz substrate. In the preferred embodiment, multiple crystal resonators are chemically milled out of a single quartz substrate and separately tuned to desired frequencies. The associated circuitry is then placed on isolated portions of the quartz either by bonding discrete circuit components to the quartz or by film deposition techniques to fabricate the additional circuit components directly on the quartz substrate. The process according to this invention includes the steps of chemical etching and patterning of the quartz substrate to generate the resonator structure and its isolation from the remainder of the quartz plate; patterning of the metallization runs to accomplish some of the circuit interconnects; placement of chip resistors, capacitors and active devices on the quartz substrate; and attachment of wire bonds. The entire quartz substrate is then solder reflowed to an alumina motherboard. This approach displays some unique advantages to circuit design and space utilization and further reduces the profile of the package.

In one example, the individual crystals are adjusted to desired frequencies by vacuum vapor deposition. The individual crystal outputs are then selectively switched via active devices to achieve the desired frequency or combination of frequencies required for a particular application. The active switching devices and portions of the signal generation and signal processing circuitry can be mounted on the quartz substrate. The remainder of the circuitry, along with the quartz substrate, is then mounted on an alumina motherboard using conventional reflow techniques. The device can be used to generate a wide variety of signal source frequencies.

In another example, one or more of the resonators are exposed to a modulating influence and, since the difference in frequency between any two resonators remains constant over a wide range of temperatures unless one of the resonator frequencies is otherwise modulated, the device provides a means of measuring the strength of any particular modulating influence by measuring the change in frequency difference between the modulated resonator and an unmodulated reference resonator.

BRIEF DESCRIPTION OF THE DRAWINGS

The invention will be more clearly understood from the following description in conjunction with the accompanying drawings, in which.

DETAILED DESCRIPTION OF THE PREFERRED EMBODIMENTS

Figure 1:
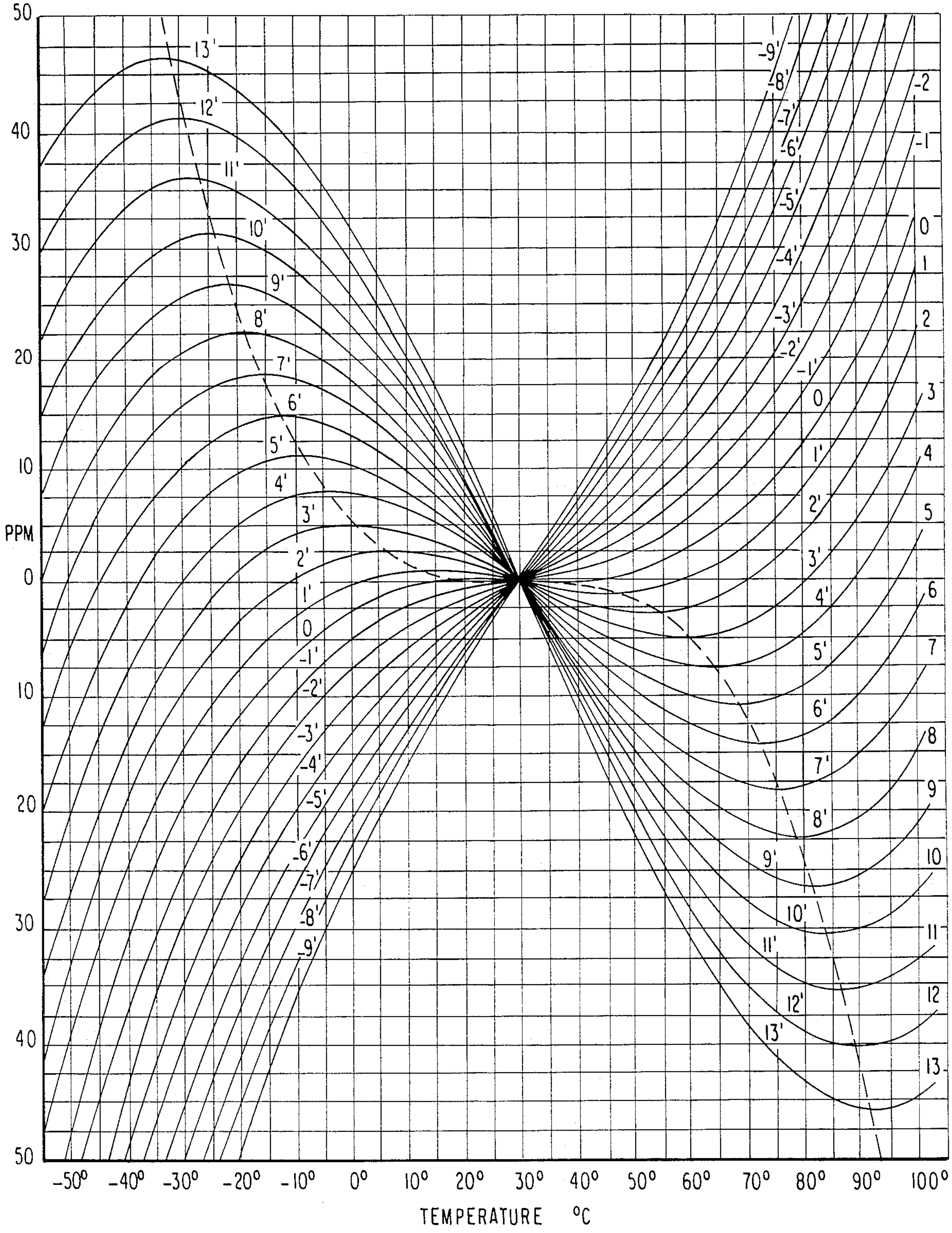
FIG. 1 is a graph indicating the dependency of the temperature coefficient of resonating frequency on the angle of cut of an AT-cut quartz crystal.
Figure 2:
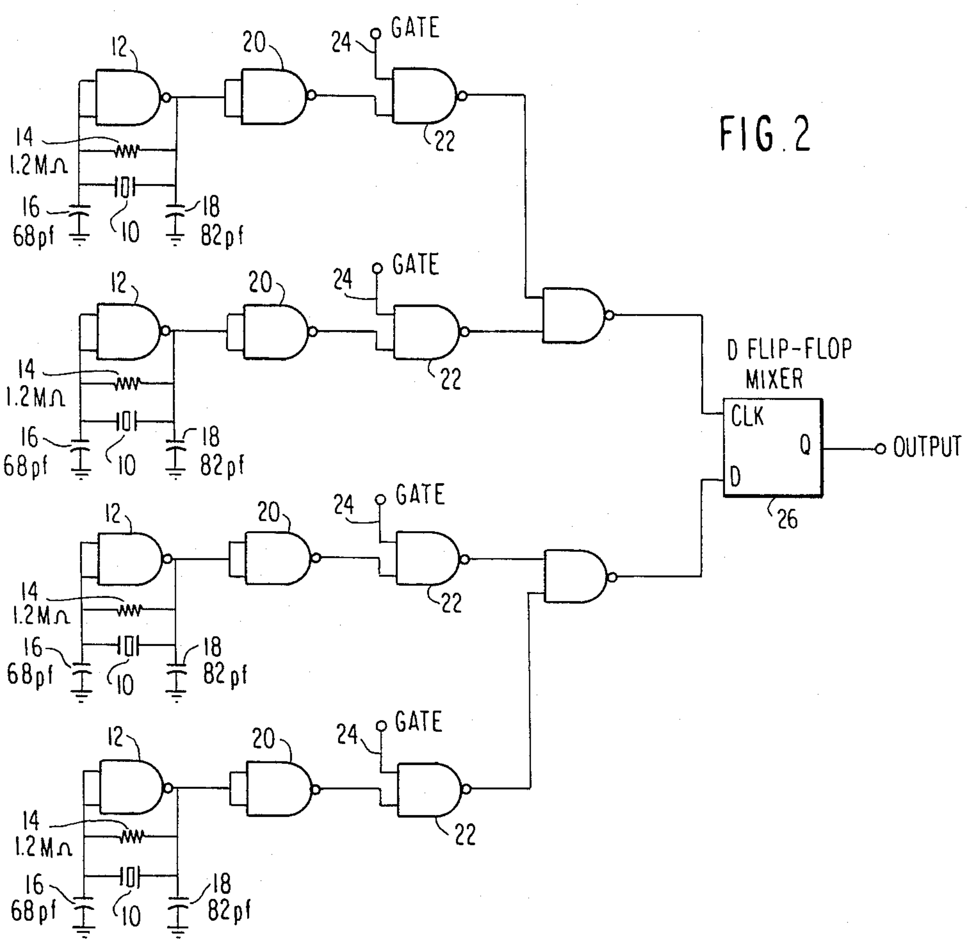
FIG. 2 is a block diagram of one example of a circuit which may be implemented in accordance with the present invention.

The circuit chosen to demonstrate the fabrication process of this invention consists of four voltage controlled quartz crystal oscillators (VCXO's) which feed into a dual D-type flip-flop (74HC74) utilized as a mixer. The block diagram of the circuit is shown in FIG. 2. Each oscillator consists of a quartz crystal 10 connected from the input to the output of a NAND gate (74HCOO) 12 acting as an inverter. The gate is linearly biased by placing a 1.2 megohm resistor 14 from the input to the output of the NAND gate. Two capacitors 16 and 18 are placed at the input and output to match the crystal to the inverter. A varactor diode and the associated biasing resistors and DC blocking capacitor (not shown) are placed in series with the resonator to effect tuning of the oscillator in a known manner. A second NAND gate 20 is used as an inverter to buffer the oscillator from the switch. The output of the buffer 20 is fed into a third NAND gate 22. A logic level "0" applied to the switching input 24 prevents the oscillator signal from reaching the mixer 26. By selecting the desired oscillator inputs to the mixer and required bias to the varactor diodes, the corresponding difference frequencies can be generated at the mixer output.

Figure 3A:
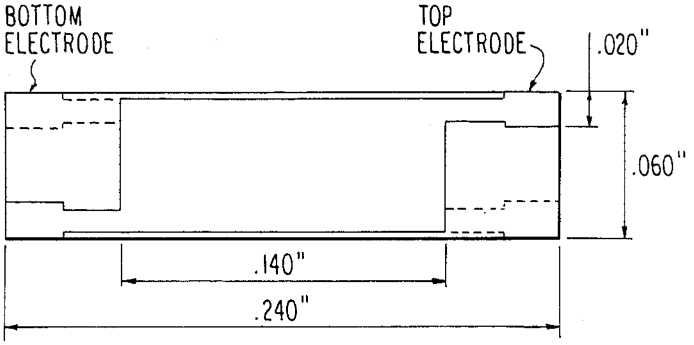
FIGS. 3A and 3B are, respectively a top and a side view of a crystal resonator fabricated according to the present invention.
Figure 3B:
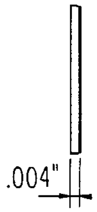

The crystals used in this invention are AT-strip resonators which operates in the thickness shear mode. In the example described herein, the resonator has a length of 0.240 inches, a width of 0.060 inches, and an active electrode length of 0.140 inches, as shown in FIG. 3A. This structure, when fabricated on a substrate approximately 0.005 inches thick, will exhibit a resonant frequency of 14.3 megahertz.

The initial step prior to the fabrication process is the layout of the photomasks. This was accomplished by using a David Mann pattern generator model 1600A. The positive pattern created by the pattern generator was placed upon an Imtec 2×2 inch type 1a glass master. This glass positive was then used as the master reticle and mounted onto a standard reticle frame. The master reticle and the frame were then loaded into a Mann GCA model 1482 step-and-repeat camera which was set up with a reduction ratio of 4:1. This produced the photomask with the desired dimensions. This photo process was then repeated using the electrode pattern to generate the electrode photomask.

The fabrication process begins with the cleaning of the quartz crystal. The cleaning method was adopted from standard procedures which have been utilized in the semiconductor industry and modified to incorporate some of the standard techniques presently exercised in the quartz crystal industry.

It should be noted that all water rinsing is performed with 18 megohm De-Ionized (D.I.) water produced with multiple demineralizer beds and reverse osmosis.

The quartz substrates were taken as supplied by the manufacturer and immersed in a saturated solution of potassium dichromate and sulfuric acid for 6 to 8 minutes and then ultrasonically agitated for an additional 2 to 3 minutes. It has been shown that hydrocarbon contamination of the surface is possible due to their presence in the air. The potassium dichromate/sulfuric acid solution forms free oxygen in the solution which is very effective in removing these contaminants. The wafer is then rinsed thoroughly with D. I. water and then placed in a beaker containing clean water and ultrasonically agitated for an additional 2 to 3 minutes. It should be mentioned at this point that, to insure proper rinsing of the substrates, the resistivity of the effluent should be monitored and rinsing continued to resistivity, i.e., until the original resistivity has been reached, indicating that all contaminants have been removed. The next cleaning step is the immersion of the substrate in a beaker containing a fresh solution of aqua regia, ultrasonically agitated for 3 minutes. This is followed by another ultrasonically assisted water rinse for 3 minutes. The substrates are then placed in boiling methanol for 2 to 3 minutes and subsequently ultrasonically agitated for an additional 2 to 3 minutes. The crystals are then allowed to cool in the methanol. It has been seen that rapid temperature changes may cause the crystalline substrates to fracture. Following the methanol treatment, the substrates are placed in a beaker of D.I. water and then heated to the boiling point for 5 to 7 minutes. They are then allowed to cool and again rinsed with water and ultrasonically agitated for 2 to 3 minutes. For the final step in the cleaning procedure, the quartz substrate is placed in a HEPA filtered warm air spinner and spun dry.

When the crystals are dry they are placed in a vacuum system and coated with 150 angstroms of chromium, followed by a gold layer approximately 3000 angstroms thick. This is accomplished by loading the crystals into a substrate holder which accommodates two quartz wafers and then placing the substrate holder directly into the plating system. The plating system used was a Varian 3117 vacuum system equipped with an Airco Temescal four hearth electron beam deposition system and an Inficon XMS-3 plating controller.

The system was evacuated to a pressure of at least $3\times10^{-6}$ Torr prior to the deposition of the metal. The chromium was heated by the electron beam system and allowed to outgas. It should be noted that a pressure drop is seen by about an order of magnitude. This is due to sublimation of the chromium and the associated gettering of some of the residual gas molecules in the system. After being allowed to outgas, the chromium was then deposited on the quartz at a rate of 10 to 20 angstroms per second to a total thickness 150 angstroms.

The hearth was then switched to the gold position and gold was deposited at a rate of 10 angstroms per second to a total thickness of 3000 angstroms. After the cool-down process, the system was vented and the wafers were then removed from the substrate holder and annealed in a vacuum furnace at a pressure of 60 microns at a temperature of 400° C. for 45 minutes.

Past experience has shown that annealing of the deposited metal greatly increases mask adhesion to the quartz. This is presumably due to the formation of silicon dioxide/chromium oxide bonds at a quartz-metal interface and the inter-diffusion of chromium into the gold layer, a phenomenon which has been well documented in the literature. Rairden et al, "Interdiffusion in Thin Conducted Films - Chromium/Gold, Nickel/-Gold and Chromium Silicide/Gold," *Metallurgical Transactions,* Vol. 2, March 1971,pp. 719–722, have shown that chromium will diffuse through a 600 angstrom gold film at 450° C. in one hour. This confirms our empirical data for excessive annealing. If the samples are annealed for times much longer than one hour, it has been seen that the gold film exhibits a greater resistance to the etchant, and for films annealed for greater than one and half hours, the gold films have remained intact for more than twenty minutes in the etchant. This is compared to films which have been properly annealed being removed by the etchant in less than one minute.

After the films have been annealed the photolithographic processing begins. The substrate is removed from the vacuum system and photoresist is deposited, baked, and patterned.

The first pattern defines the resonator geometry. This is accomplished using the island mask. First, the plated quartz plate is placed on the vacuum chuck of a Headway photoresist spinner and Shipley type 1350J positive working resist is applied to the quartz. The substrate is then spun for 20 seconds at 4000 rpm to spread the photoresist evenly to a thickness of approximately 1.7 microns. The substrate is then placed in a fresh air convection oven at 90° C. for 1 minute to dry the first side. The wafer is then returned to the spinner and the other side is coated with photoresist. The sample is then removed from the spinner and returned to the convection oven for 25 minutes. The light sensitive wafer is then placed in the alignment jig previously described and exposed for 30 seconds to high intensity ultraviolet (UV) radiation. The exposed wafer is then developed in Shipley Microposit type 351 developer diluted 4:1 D.I. water/developer for approximately 45 seconds and rinsed thoroughly with D.I. water. The developed substrate is then postbaked in a fresh air convection oven at 120° C. for 20 minutes.

The quartz plate is then removed from the oven and placed in $KI,I_2$, $H_2O(13)$, gold etch for 15 to 20 seconds (this patterns the gold film to the resonator geometry). The sample is then placed in the chromium etchant consisting of cerric sulfate, sulfuric acid and water to remove the exposed chromium.

The island pattern is then placed in Shipley 1112A photoresist remover to remove the photoresist. The wafer is then rinsed with D.I. water and placed in a cleaning solution consisting of potassium dichromate and sulfuric acid. The solution is heated until boiling (moderately) and allowed to boil for 10 minutes. The heated solution is then placed in the ultrasonic cleaner for 3 minutes. A D.I. water rinse follows and then a final cleaning in methanol which ultrasonically agitated for 1 minute. The purpose of the dichromate solution and the methanol is to clean the wafer surface, the cleaner the surface the better the adhesion of the photoresist. It has been found that substituting methanol for the dichromate solution in the above steps also works, but not as consistently. Good adhesion of the photoresist to the gold layer must take place, because in the quartz etch the photoresist is exposed to saturated ammonium bifluoride for 4 to 5 hours. Samples have been etched in which the photoresist stayed intact for 8 to 9 hours.

A second layer of photoresist is then applied and defines the electrode pattern. The electrode geometry is exposed using a Kasper model 17A makaligner, and the photoresist is patterned. The exposure is for 35 seconds and the sample is then developed for approximately 75 seconds. After developing, the wafer is post-baked at 120° C. for 20 minutes as described previously. The sample is then ready for the quartz etching process.

The exposed quartz wafer is placed in an agitated saturated ammonium bifluoride solution at 80° C. and the temperature is maintained at the etching temperature for approximately 4 to 5 hours until the wafer has been etched completely through.

Figure 4:
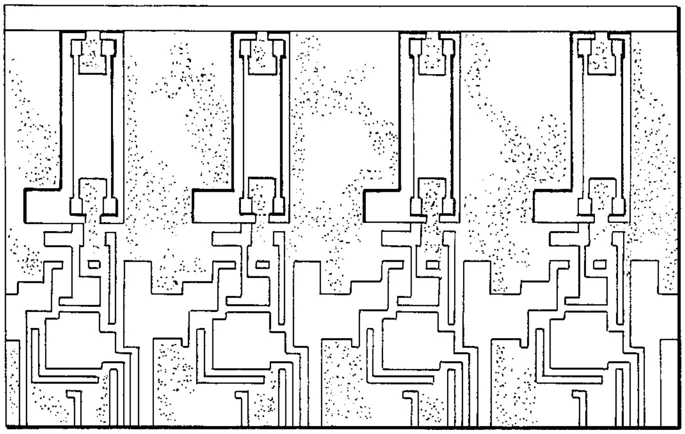
FIG. 4 is a top view showing the etched electrode and interconnect patterns.
Figure 5:
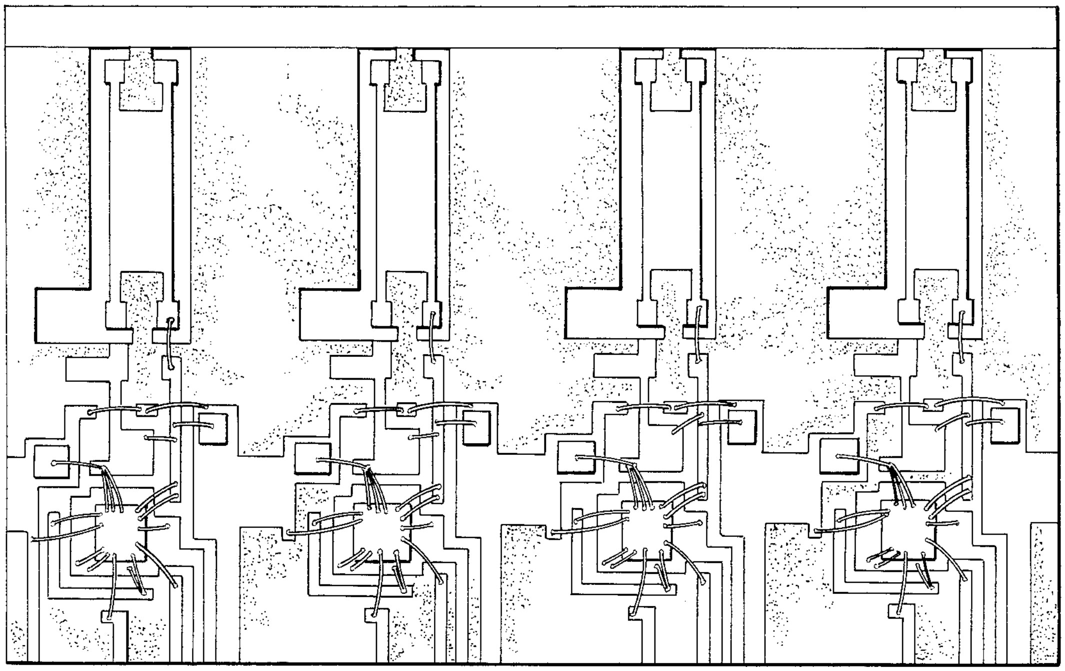
FIG. 5 is a top view showing the discrete circuit components mounted on the substrate in accordance with one embodiment of the present invention.
Figure 6:
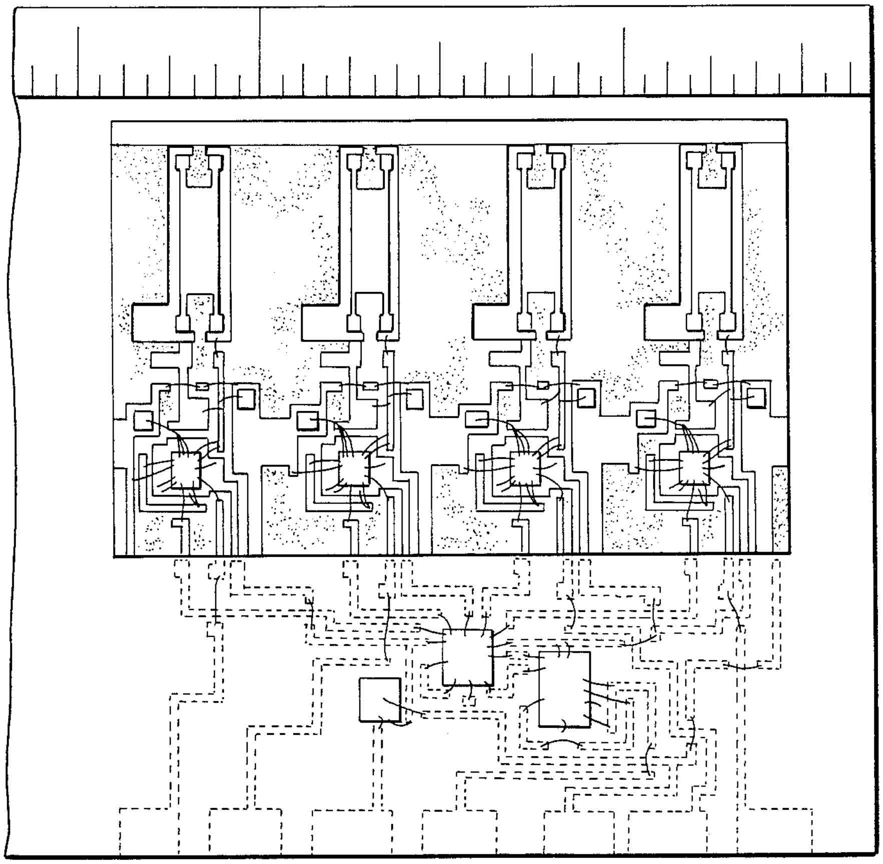
FIG. 6 is a top view showing the completed quartz substrate soldered to an alumina motherboard.

After the quartz is etched, the electrode pattern and the interconnect pattern are etched in the chromium/- gold film as shown in FIG. 4. The etching process also patterns the metal interconnections and contact pads for the active and passive devices. The capacitors, resistors, and active devices are mounted on the substrate via conductive epoxy and wire-bonded using conventional thermosonic bonding techniques as shown in FIG. 5. As shown in FIG. 6, the completed quartz substrate is then soldered via reflow techniques to the alumina motherboard containing the remainder of the circuitry. The screened metallization is of gold and follows 10 mil line widths and 10 mil spacing. The electrical connection from the back side electrode of the crystal to the alumina motherboard is accomplished by wire-bonding through a window etched in the quartz substrate.

Figure 7:
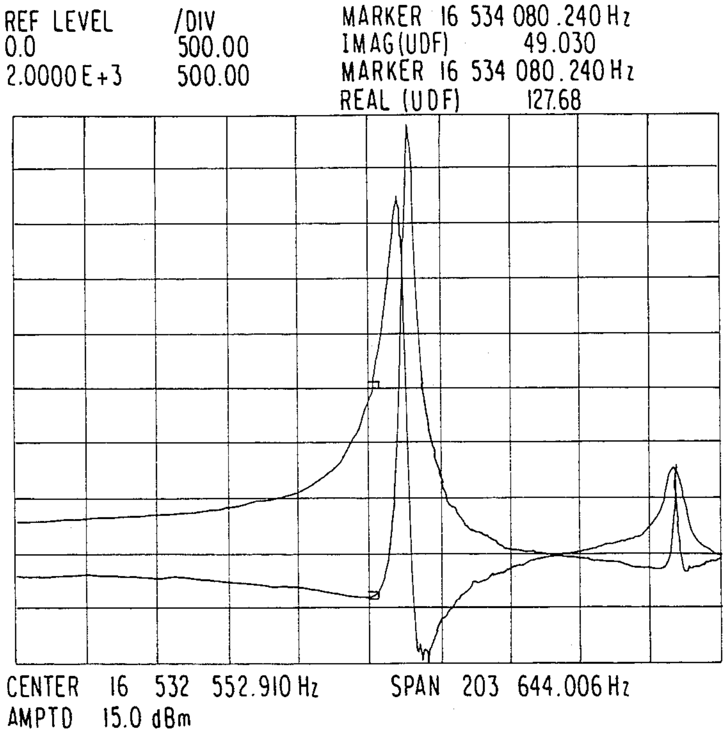
FIG. 7 is a plot showing the amplitude vs. frequency for real and imaginary components in a 16 MHz resonator.
Figure 8:
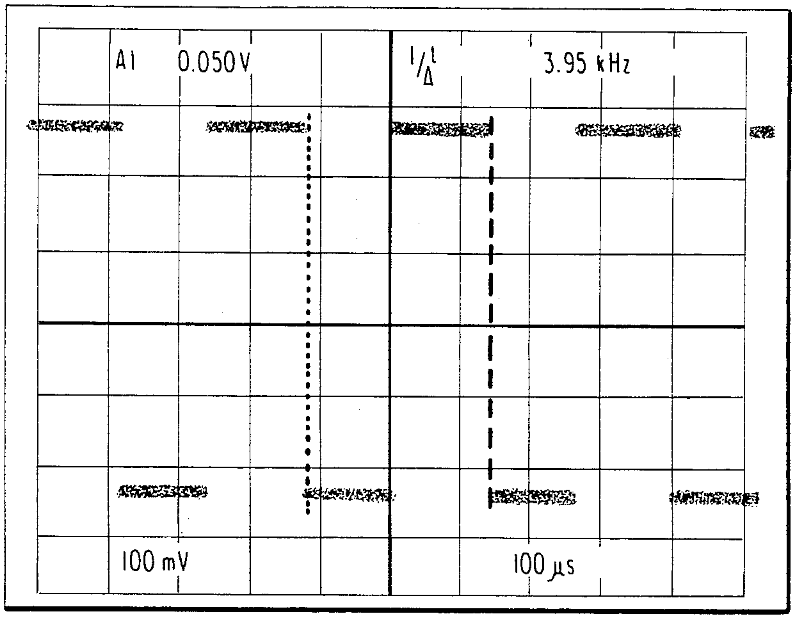
FIG. 8 illustrates an output waveform from the mixer of FIG. 2.

A plot of a typical 16 megahertz resonator impedance showing real and imaginary components versus frequency is shown in FIG. 7. It can be seen from this plot that the crystal exhibits a resistance of approximately 130 ohms at the series resonance frequency of 16.534 megahertz. FIG. 8 shows an example of the output frequency and output waveform from the mixer. The oscillators typically display a frequency stability of 4 ppm over the rated voltage range of the HMOS IC's, 4.75 to 5.25 volts.

This process demonstrates the capability of combining wet chemical processing and thin film and thick film techniques to produce a Stable Hybridized Integrated Frequency Source (SHIFS), fabricated on a piezoelectric quartz substrate containing much of the signal generation circuitry. The entire frequency generation circuitry can be hermetically sealed in a low profile flat pack and mounted via standard reflow processes to the remainder of the circuitry.

It can be readily seen that this series of processing techniques can be extrapolated to any application where quartz resonators are used. Crystal oscillators and/or crystal filters operating near the same frequency could have the crystal resonators and circuitry all supported by a single wafer of quartz. This will permit all of the frequency sensitive components to be mounted in one small, hermetically sealed package. The limitation of the technique in providing quartz resonator frequency generation and filtering circuitry is limited only by the imagination of the design engineer.

There are many applications in which the fabrication process of the present invention can be employed to overcome the difficulties encountered heretofore in achieving and maintaining a condition of balance between two (or more) quartz resonators. First, an assembly of resonators is fabricated all at the same time, and all on the same quartz substrate. Thus, despite any possible slight deviations of the angle of cut from the optimum value, the resonators all have the same angle of cut and the same temperature coefficient and will all track over a range of operating temperatures. Second, the resonators may be mechanically and electrically isolated from each other so that they oscillate independently. Third, the oscillation frequencies of the resonators can be adjusted separately to different desired values during manufacture so that the predetermined differences in frequency between one resonator and another remain fixed over a range of operating temperatures and over time if no other influences are brought to bear on the oscillation frequencies of any of the individual resonators. If the frequency of one of the resonators is then disturbed by some modulating influence, the change in the frequency difference between this resonator and any of the others must be predominantly due to the modulating influence, even if the change occurs over time and even if the temperature has not been constant. This provides a means of measuring the strength of the particular modulating influence by measuring the change in the frequency difference.

In the example described in detail above and shown in FIG. 2, the stable frequency output if obtained by taking the difference frequencies of selected oscillators. In the additional examples described below, this general principle is also utilized, with the introduction of a modulating influence to one or more of the oscillators. In each of the examples described below, note that signals are obtained by taking the frequency difference between two common-substrate resonators, one receiving a modulating effect and the other not receiving any effect. Example 5 may be included with Examples 2–4 if turning a resonator off is considered to be a shift of its frequency to zero.

EXAMPLE 2

Figure 9A:
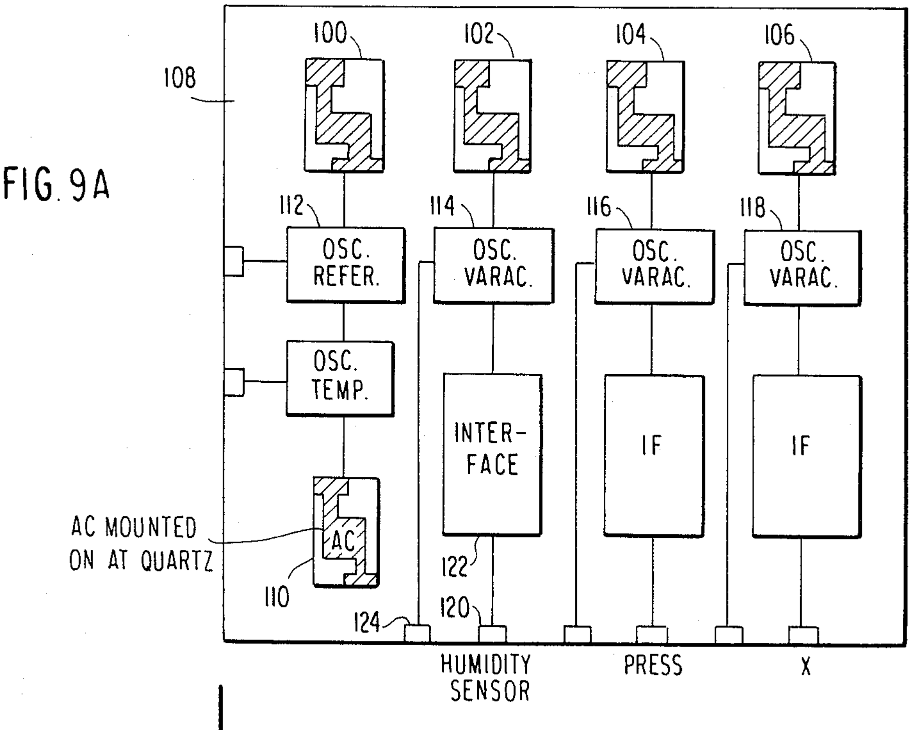
FIG. 9A is a layout illustration of a sensing device according to a second example of the present invention.
Figure 9B:
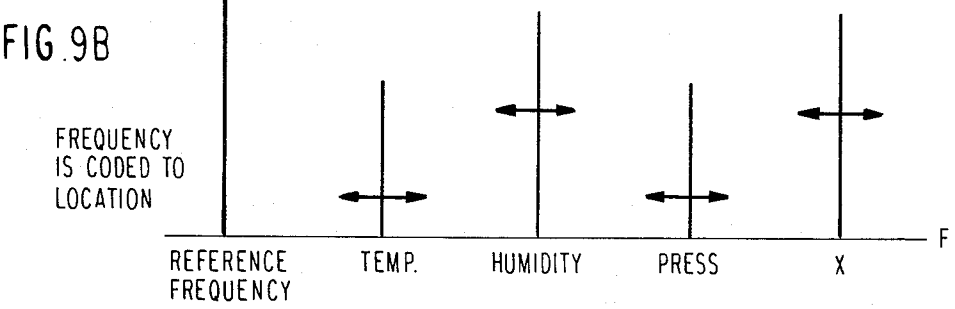
FIG. 9B is a plot showing the allocation of different resonating frequencies to different sensed parameters in the example of FIG. 9A.

Referring to the FIGS. 9A and 9B, it is seen that a number of resonators 100, 102, 104 and 106 are constructed on one quartz substrate 108. In addition, one AC-cut quartz wafer 110 has been mounted on the substrate to provide temperature information. Each of these resonators can be adjusted to provide sidebands on a carrier, e.g., with their operating frequencies spaced as shown in FIG. 9B. Each in turn can have an oscillator and modulator circuit 112, 114, 116 and 118 that would permit information to be placed on the subcarrier. In some cases the resonator itself could provide the transducer action. That is, its frequency would be directly affected by strain, pressure, temperature or surface loading. Using adjacent crystals as: reference; temperature sensor (AC-cut); pressure transducer (flexible diaphragm); strain gate etc., the frequency of each sensor would be beat against the frequency of the reference and the result would be the signal. These signals could, of course, be transmitted and the information decoded in a receiver.

In the example shown in FIG. 9A, the oscillator circuit 112, which would include a varactor diode or other capacitive tuning circuit, would be adjusted to provide a desired reference frequency. The circuits 114–118 would similarly be adjusted to provide desired reference frequencies. A humidity sensor would provide an input signal at terminal 120 which would be passed via interface 122 to the control input of the varactor tuning circuit in the oscillator circuit 114, thus modulating the output frequency at terminal 124. Pressure sensing and "X" (a generic designation for additional sensed parameters) would operate in a similar manner.

EXAMPLE 3

Figure 10:
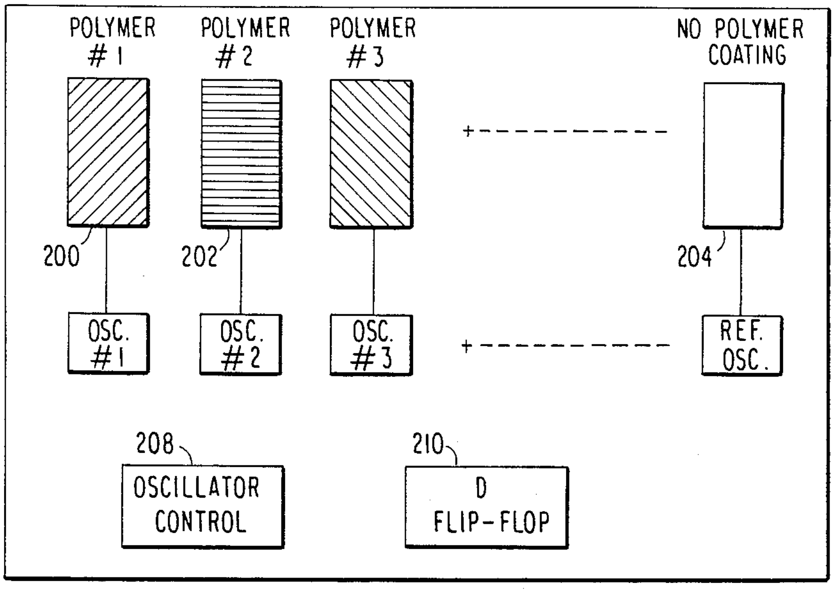
FIG. 10 is a layout diagram of a sensing device according to a third example of the present invention.

In this example, shown in FIG. 10, several of the bulk mode resonators are coated with different polymers that have various affinities for different gases. Polymer #1 on resonator 200 might respond to gases as: gas #1, 0.02; gas #2, 0.003; gas #3, 0.6 and so on. Polymer #2 on resonator 202 might respond as 0.003 to gas #1, 0.009 to gas #2 etc. It can be seen that there is thus an n by n array of responses of the n resonators to the n gases. Note that the frequency of each crystal has been shifted by the accumulated effect of each gas. If one resonator 204 is protected from the gases, it will retain its original frequency, and the change in the beat between it and each of the other resonators is due to the accumulated effect of all the gases absorbed on that resonator. With n equations and n unknowns we can determine the amount of each of the n gases in the environment from the n measured changes in beat frequency. The oscillator control 208 and D flip-flop 210 are similar in design and operation to the combinational circuits shown in FIG. 2.

EXAMPLE 4

Figure 11:
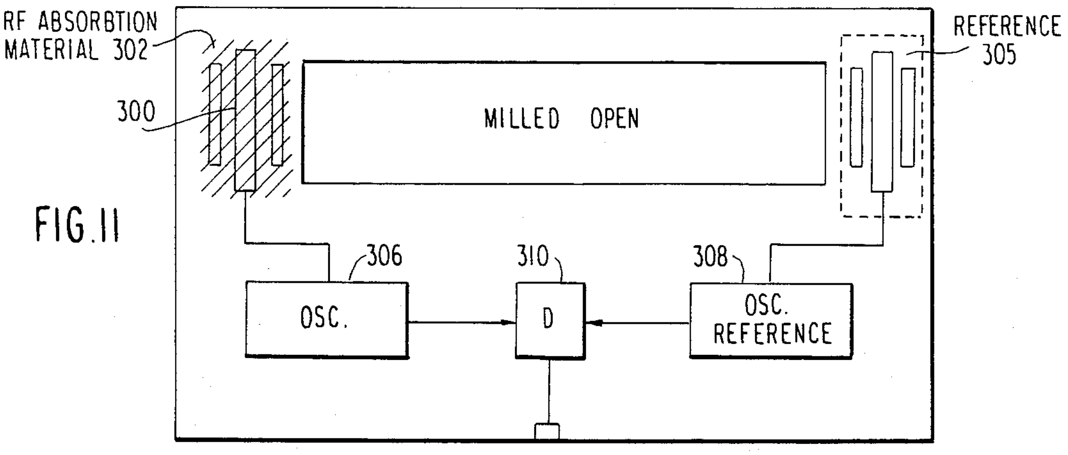
FIG. 11 is a layout diagram of a sensing device according to a fourth example of the present invention.

In this example, shown in FIG. 11, an RF strength detector is obtained by forming a resonator 300 at one of the quartz wafer coated with an rf absorbing material 302, and a reference resonator 304 at the other end of the wafer. RF striking the absorption material 302 will generate heat, thereby changing the temperature of the resonator 300. The beat note between the oscillators 306 and 308, as detected by the differential amplifier 310, will indicate the strength of rf falling on the one resonator.

EXAMPLE 5

Figure 12A:
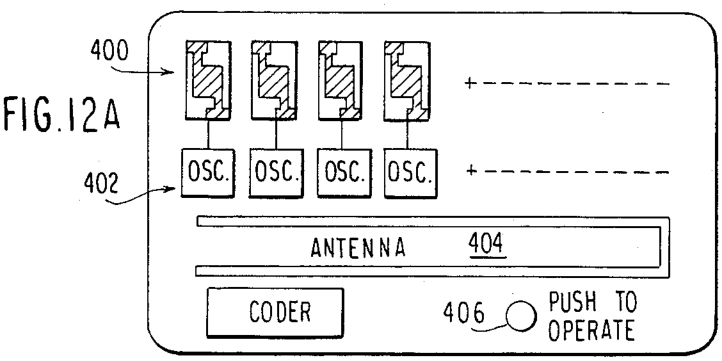
FIG. 12A is a layout diagram of a security device according to a fifth example of the present invention.
Figure 12B:
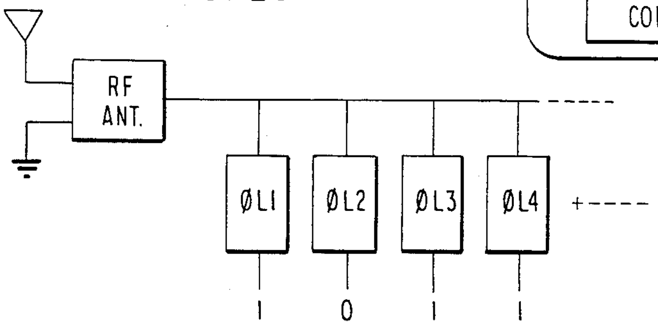
FIG. 12B is a block diagram of a receiving circuit to be used in conjunction with the device of FIG. 12A.

In this example shown in FIG. 12A, we provide an array of resonators 400 and oscillators 402, with coder switches for the user so that certain oscillators can be turned on and others off. If we have n oscillators, there are $2^n$ possible combinations. The wafer also contains a small ferrite antenna 404 that will trnasmit the signals when the button 406 is pushed. If an accompanying receiving circuit, e.g., as shown in FIG. 12B, with a small receiving antenna is placed near a lock, then if the right spectrum of frequencies is received from the transmitter, the lock will be activated.

This application takes advantage of the small space and simplified interconnections mentioned above, but not of the stabilization of difference frequencies.

It will be appreciated that various changes and modifications can be made to the embodiments described above without departing from the spirit and scope of the invention as defined in the appended claims.

What is claimed is:

1. A multiple oscillator device, comprising:

a crystal substrate;

a plurality of oscillators including: a first oscillator including an AT-cut first crystal resonator having a resonant frequency, and a first oscillation control circuit for controlling the oscillation output of said first oscillator, said first oscillation control circuit including means for receiving a first control signal indicating the value of a first parameter to be sensed and modulating said first oscillator output in accordance with said first control signal; and a second oscillator including a AT-cut second crystal resonator formed in said substrate at the same time as said first crystal resonator and having a resonant frequency, and a second oscillation control circuit for controlling the oscillation output of said second oscillator, said second oscillation control circuit controlling said output of said second oscillator independently of the value of said first parameter to be sensed;

signal processing means for processing outputs from said oscillators to obtain a desired output signal; and isolation means disposed between adjacent resonators for decreasing the capability of said substrate to propagate frequencies in a range which includes the resonant frequencies of said resonators while maintaining common structural support of all of said resonators by said substrate.

2. A multiple oscillator device as defined in claim 1, wherein said plurality of oscillators further includes a third oscillator including an AC-cut crystal resonator providing an output having a frequency proportional to ambient temperature, and said signal processing means responds to outputs from all of said first, second and third oscillators to provide an output signal representing the value of said first parameter.

3. A multiple oscillator device as defined in claim 2, wherein each of said first, second and third oscillators oscillates at a different respective frequency in the absence of an external modulating influence.

4. A multiple oscillator device, comprising:

a crystal substrate;

a plurality of crystal oscillators each providing an output, said plurality of crystal oscillators comprising: a first oscillator including an AT-cut crystal resonator coated with an RF absorption material sensitive to RF level, said first oscillator having a resonant frequency; and a second oscillator having an AT-cut crystal resonant having a resonant frequency and formed in the substrate at the same time as said first resonator, said second oscillator oscillating at a frequency independent of said RF level, whereby the value of said RF level can be detected by comparing the outputs of said first and second oscillators;

signal processing means for processing outputs from said oscillators to obtain a desired output signal; and isolation means disposed between adjacent resonators for decreasing the capability of said substrate to propagate frequencies in a range which includes the resonant frequencies of said resonators while maintaining common structural support of all of said resonators by said substrate.

5. A multiple oscillator device of the type comprising a crystal substrate, a plurality of crystal oscillators each providing an output and signal processing means for processing outputs from said oscillators to obtain a desired output signal, each of said oscillators including a respective crystal resonator having a respective resonant frequency, the crystal resonators of said plurality of oscillators each being formed at the same time in said substrate, said device including isolation means in the form of a gap in said substrate between adjacent resonators for decreasing the capability of said substrate to propagate frequencies in a range which includes the resonant frequencies of said resonators while maintaining common structural support of all of said resonators by said substrate.

6. A multiple oscillator device of the type comprising a crystal substrate, a plurality of crystal oscillators each providing an output and signal processing means for processing outputs from said oscillators to obtain a desired output signal, each of said oscillators including a respective crystal resonator having a respective resonant frequency, the crystal resonators of said plurality of oscillators each being formed at the same time in said substrate, said device including isolation means disposed between adjacent resonators for decreasing the capability of said substrate to propagate frequencies in a range which includes the resonant frequencies of said resonators while maintaining common structural support of all of said resonators by said substrate, said isolation means comprising a region where at least a substantial portion of said substrate has been removed.

7. A multiple oscillator device as defined in claim 6, wherein said crystal resonators are quartz resonators milled from a common quartz substrate.

8. A multiple oscillator device as defined in claim 7, wherein said plurality of resonators are AT-strip resonators, and said signal processing means comprises combining means for combining outputs from selected ones of said oscillators to obtain an output signal having a desired frequency.

9. A multiple oscillator device as defined in claim 8, wherein said combining means comprises coder means for designating particular ones of said plural oscillators to be activated, means for selectively activating the oscillators designated by said coder means and antenna means coupled in common to all of said oscillators for transmitting said desired output signal.

10. A multiple oscillator device as defined in claim 9, further comprising receiving means for receiving the signal transmitted by said antenna means, and means coupled to said receiving means for detecting which of said oscillators have been activated.

11. A multiple oscillator device as defined in claim 6, wherein said plurality of oscillators includes:

a first oscillator including an AT-cut crystal resonator coated with a first material sensitive to at least first and second gases of interest; and a second oscillator including an AT-cut crystal resonator coated with a second material sensitive to at least said first and second gases of interest, said second material having a sensitivity which differs from the sensitivity of said first material with respect to at least one of said first and second gases, whereby the concentration of said first and second gases can be detected by comparing the ouputs of said first and second oscillators.

12. A multiple oscillator device as defined in claim 11, wherein said plurality of oscillators further includes an additional oscillator having an AT-cut crystal resonator and oscillating at a frequency independent of the concentration of either of said first or second gases.

13. A multiple oscillator device as defined in claim 6, wherein each of said crystal resonators is chemically milled out of a single quartz substrate.

14. A multiple oscillator device as defined in claim 6, wherein each said oscillator further includes oscillator circuitry cooperating with its repective resonator for generating a respective crystal oscillator output, and wherein the oscillator circuitry for each oscillator is mounted on said crystal substrate.

* * * * *